United States Patent [19]

Simpson

[11] Patent Number: 5,620,745
[45] Date of Patent: Apr. 15, 1997

[54] METHOD FOR COATING A SUBSTRATE WITH DIAMOND FILM

[75] Inventor: Matthew A. Simpson, Sudbury, Mass.

[73] Assignee: Saint Gobain/Norton Industrial Ceramics Corp., Worcester, Mass.

[21] Appl. No.: 574,750

[22] Filed: Dec. 19, 1995

[51] Int. Cl.$^6$ .............................. C23C 16/26; C23C 16/44
[52] U.S. Cl. ..................... 427/249; 427/299; 427/398.1
[58] Field of Search .................................. 427/249, 299, 427/314, 398.1; 423/446

[56] References Cited

U.S. PATENT DOCUMENTS

| | | | |
|---|---|---|---|
| 4,471,003 | 9/1984 | Cann | 427/34 |
| 4,487,162 | 12/1984 | Cann | 118/723 |
| 4,707,384 | 11/1987 | Schachner et al. | 427/255.2 |
| 4,900,628 | 2/1990 | Ikegaya et al. | 428/408 |
| 4,987,002 | 1/1991 | Sakamoto et al. | 427/249 |
| 4,988,421 | 1/1991 | Drawl et al. | 204/192 |
| 5,006,203 | 4/1991 | Purdes | 156/646 |
| 5,110,579 | 5/1992 | Anthony et al. | 423/446 |
| 5,114,745 | 5/1992 | Jones | 427/113 |
| 5,124,179 | 6/1992 | Garg et al. | 427/249 |
| 5,131,963 | 7/1992 | Ravi | 148/33.3 |
| 5,139,372 | 8/1992 | Tanabe et al. | 407/118 |
| 5,204,144 | 4/1993 | Cann et al. | 427/569 |
| 5,224,969 | 7/1993 | Chen et al. | 51/295 |
| 5,260,106 | 11/1993 | Kawarada et al. | 427/577 |
| 5,270,077 | 12/1993 | Knemeyer et al. | 427/249 |
| 5,272,104 | 12/1993 | Schrantz et al. | 437/63 |
| 5,286,524 | 2/1994 | Slutz et al. | 427/249 |
| 5,294,381 | 3/1994 | Iguchi et al. | 264/25 |
| 5,310,512 | 5/1994 | Bigelow | 264/25 |
| 5,314,652 | 5/1994 | Simpson et al. | 264/81 |

FOREIGN PATENT DOCUMENTS

| | | |
|---|---|---|
| 284190B1 | 9/1988 | European Pat. Off. . |
| 0442303A1 | 8/1991 | European Pat. Off. . |
| 0467043 | 1/1992 | European Pat. Off. . |
| 0523968A1 | 1/1993 | European Pat. Off. . |
| 63-307196 | 12/1988 | Japan . |

OTHER PUBLICATIONS

Abstract (Dialog) From Diamond Film Update of Jun. 16, 1994—"CVD Diamond Film Without Stress Cracks" (1 sheet).

*Primary Examiner*—Roy V. King
*Attorney, Agent, or Firm*—Volker R. Ulbrich; Martin M. Novack

[57] ABSTRACT

A method for depositing synthetic diamond film on a substrate, including the following steps: pre-stressing the substrate to obtain a pre-deposition stress across a surface thereof; depositing the diamond film on the pre-stressed substrate surface; and cooling the film and substrate, and relieving the pre-deposition stress during the cooling. When the substrate has a higher coefficient of thermal expansion than the diamond film, the pre-stress is a compressional stress. When the substrate has a lower coefficient of thermal expansion than diamond film, the pre-stress is a tensile stress.

18 Claims, 7 Drawing Sheets

1

METHOD FOR COATING A SUBSTRATE WITH DIAMOND FILM

FIELD OF THE INVENTION

This invention relates to depositing synthetic diamond and, more particularly, to depositing diamond film as a coating on substances that have coefficients of thermal expansion that are not well matched to the coefficient of thermal expansion of diamond film.

BACKGROUND OF THE INVENTION

Diamond has a number of properties which make it attractive for use as a coating for various materials. Among these properties are extreme hardness, inertness, and excellent transmissivity of certain radiation. Diamond is also an extraordinary heat conductor, thermally stable, and an electrical insulator.

In recent years, a number of techniques have been developed for depositing polycrystalline diamond film on surfaces of various substances. One preferred technique is chemical vapor deposition ("CVD"), for example plasma beam CVD or microwave plasma CVD, wherein plasmas of a hydrocarbon and hydrogen are used to grow diamond film.

For certain applications, it may be desirable to deposit synthetic diamond on various types of substrate materials. [As used herein, the term substrate is used generically, and can be any suitable material of any suitable shape.] Some substrate materials have a coefficient of thermal expansion that is relatively similar to that of synthetic diamond. When synthetic diamond is deposited at elevated temperature on such material, and then cools to room temperature, the relatively small difference in coefficient of thermal expansion between the diamond film and the substrate generally does not give rise to excessive stresses at the substrate/diamond interface upon cooling. However, if it is necessary or desirable to deposit synthetic diamond on a substrate having a coefficient of thermal expansion that is relatively dissimilar to that of diamond film (e.g. more than ten percent greater or less than the coefficient of thermal expansion of synthetic diamond), the stress on the diamond film that results from incremental displacement of the substrate upon cooling, can have deleterious effects, such as cracking of the diamond film.

It is among the objects of the present invention to prevent the described type of problem that can arise when depositing diamond film on a substrate having a coefficient of thermal expansion that is poorly matched to diamond.

SUMMARY OF THE INVENTION

In accordance with a feature of the present invention, a pre-deposition stress is applied to the substrate. Upon relieving of the pre-deposition stress during cooling after the deposition, the resulting strain opposes and compensates for the incremental displacement of the substrate with respect to the diamond film that results from the difference in the coefficients of thermal expansion of the diamond film and the substrate material.

The present invention is directed to a method and apparatus for depositing synthetic diamond film on a substrate. The method of the invention includes the following steps: pre-stressing the substrate to obtain a pre-deposition stress across a surface thereof; depositing the diamond film on the pre-stressed substrate surface; and cooling the film and substrate, and relieving the pre-deposition stress during the cooling. When the substrate has a higher coefficient of thermal expansion than the diamond film, the pre-stress is a compressional stress. When the substrate has a lower coefficient of thermal expansion than diamond film, the pre-stress is a tensile stress.

In a preferred embodiment of the invention, the step of prestressing the substrate comprises applying compressional stress or tensile stress substantially in the plane of the substrate surface. In this embodiment, the pre-deposition stress preferably results in a strain magnitude of at least $10^{-4}$ in the substrate surface.

In a disclosed embodiment of the invention, the pre-stress is applied to the substrate by bending the substrate. In another disclosed embodiment, the pre-stress is applied by applying a thermal gradient across the thickness of the substrate while substantially preventing the substrate from bending.

Further features and advantages of the invention will become more readily apparent from the following detailed description when taken in conjunction with the accompanying drawings.

DETAILED DESCRIPTION

Figure 1:
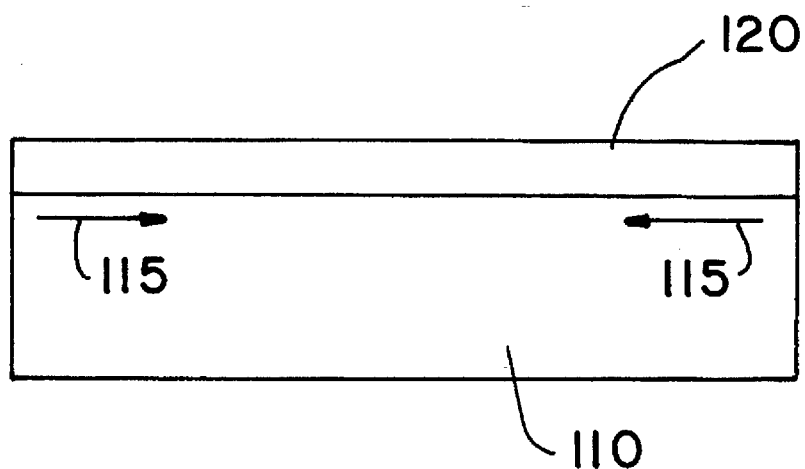
FIG. 1 shows a diamond film deposited on a substrate having a higher coefficient of thermal expansion than the diamond film, and the tensile residual stress in the substrate that occurs upon cooling after deposition.
Figure 2:
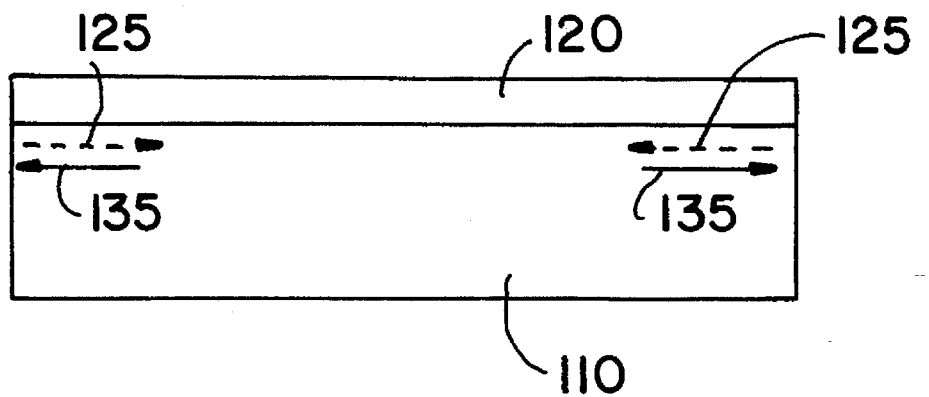
FIG. 2 illustrates how a compressive pre-stress can be applied in the situation of FIG. 1 to provide a strain that compensates for the incremental contraction of the substrate.

FIG. 1 is a diagram of a substrate 110 and a diamond film 120 which has been deposited thereon at an elevated deposition temperature, typically at least 500° C. In the example of FIG. 1, the substrate has a higher coefficient of thermal expansion (CTE) than the diamond film. If the diamond film and the substrate, or at least the top surface of the substrate, are at approximately the same temperature upon completion of deposition, upon cooling, the substrate, having the higher CTE, will contract more than the diamond. This incremental contraction, represented by the arrows 115, puts a compressive stress on the diamond film. The compressive stress, which depends on the magnitude of the CTE mismatch and the magnitude of the temperature excursion during cooling, ΔT, may be large enough to crack or shatter the diamond film. In a technique hereof, as illustrated in FIG. 2, the substrate is pre-stressed to obtain a strain, upon release of the pre-stress, that compensates for the anticipated incremental contraction due to thermal mismatch. The pre-stress is illustrated in FIG. 2 by the dashed arrows 125 and is seen to be a compressive pre-stress. Upon release of the pre-stress, the resulting strain in the surface region of the substrate, represented by arrows 135, tends to expand the substrate and to compensate for the problematic incremental contraction of the substrate.

Figure 3:
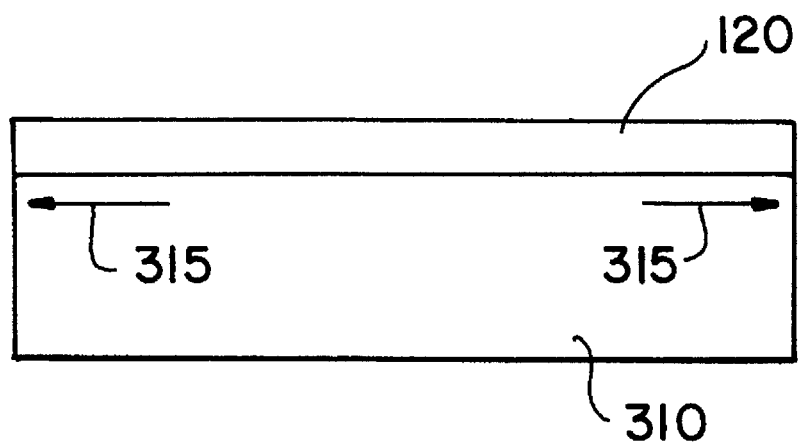
FIG. 3 shows a diamond film deposited on a substrate having a lower coefficient of thermal expansion than the diamond film, and the compressive residual stress in the substrate that occurs upon cooling after deposition.
Figure 4:
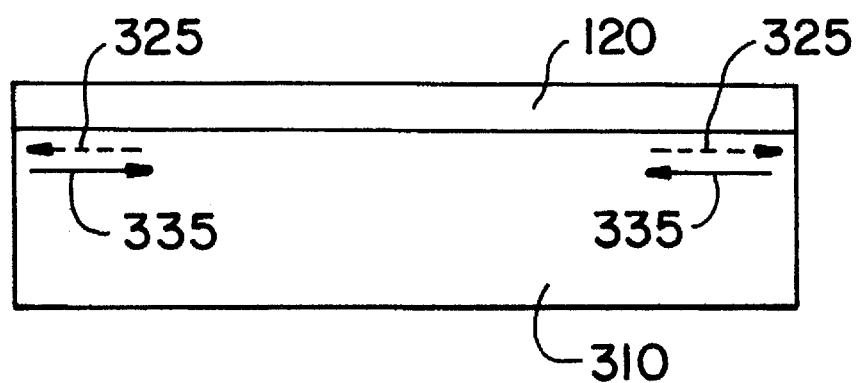
FIG. 4 illustrates how a tensile pre-stress can be applied in the situation of FIG. 3 to provide a strain that compensates for the incremental relative expansion of the substrate.

FIGS. 3 and 4 show the opposite situation from that of FIGS. 1 and 2. In FIG. 3, the substrate 310 has a lower coefficient of thermal expansion than the diamond film 120 deposited thereon. In this case, upon cooling of the diamond and the substrate after deposition, the substrate will contract less than the diamond film. The incremental relative "expansion" of the substrate, represented by the arrows 315 in FIG. 3, give rise to a tensile stress on the diamond film. In this case, as illustrated in FIG. 4, the material of the top surface of the substrate is pre-stressed to obtain a strain, upon release of the pre-stress, that compensates for the anticipated incremental relative expansion due to thermal mismatch. The pre-stress is represented in FIG. 4 by the dashed arrows 325, and is seen to be a tensile pre-stress. Upon release of the pre-stress, the resulting strain in the surface region of the substrate, represented by arrows 335, tends to contract the substrate and to compensate for the problematic incremental contraction of substrate.

Figure 5:
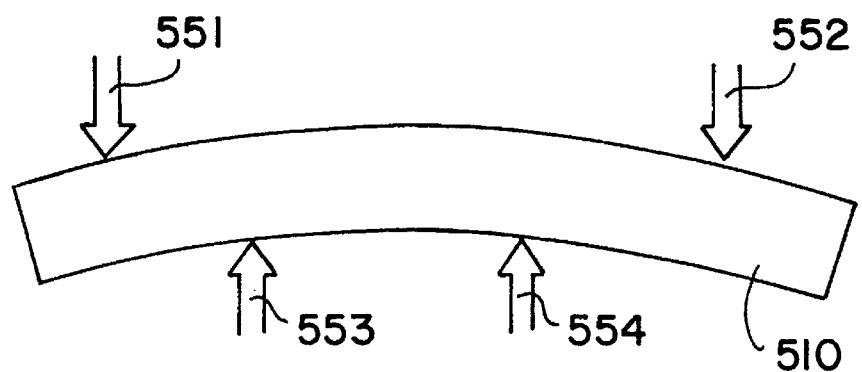
FIG. 5 illustrates how a tensile pre-stress can be applied to the substrate top surface by bending the substrate.
Figure 6:
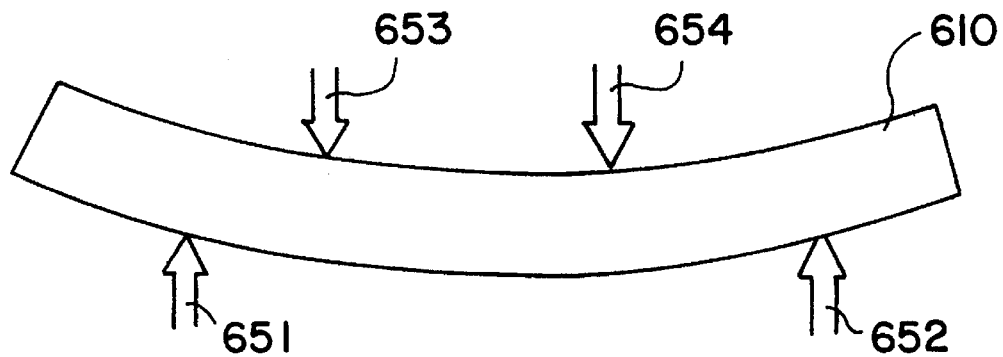
FIG. 6 illustrates how a compressional pre-stress can be applied to the substrate top surface by bending the substrate in the direction opposite to that of FIG. 5.

FIG. 5 illustrates a technique for applying a tensile prestress in the top surface of a substrate 510 by bending the substrate, such as by using forces represented at 551, 552, 553 and 554. The forces can be implemented, for example, mechanically or by using a pressure gradient. FIG. 6 shows the opposite situation, where the top surface of a substrate 610 is pre-stressed in compression by application of forces represented at 651, 652, 653, and 654.

Figure 7:
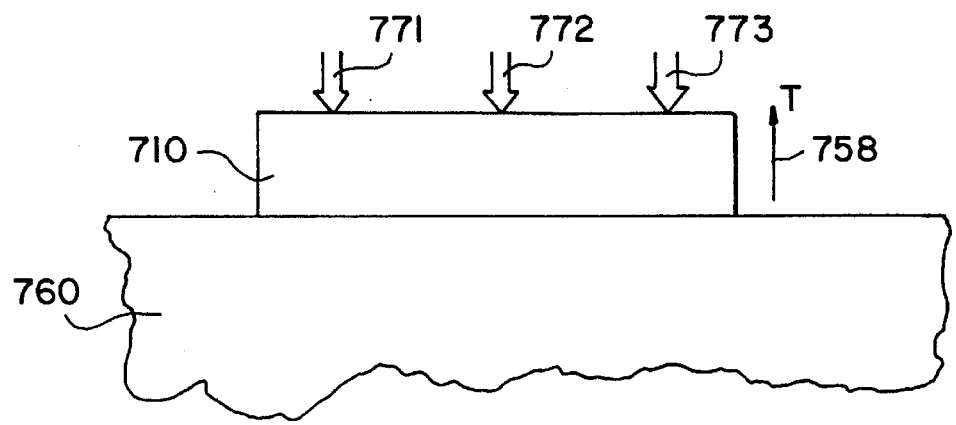
FIG. 7 illustrates how application of a temperature gradient in the thickness direction of a substrate, together with constraint against bending, can result in a pre-stress of the substrate.

A compressive pre-stress can be implemented by applying a thermal gradient in the substrate thickness direction, while restraining the substrate from substantial movement that would tend to relieve the pre-stress resulting from the temperature gradient. This is illustrated in FIG. 7, which shows a substrate 710 restrained from bending by the combination of a solid base surface 760 below and a force from above represented at 771, 772 and 773. An arrow 758 represents a temperature gradient in the thickness direction of the substrate 710, with the higher temperature at the top surface of the substrate. The temperature gradient would normally cause greater expansion at the top of the substrate than at the bottom, and would tend to make the substrate bow into a convex shape (looking from the top). However, by preventing the temperature gradient induced stress from causing any substantial bow of the substrate, a compressive pre-stress results. Upon removal of the temperature gradient (e.g. occurs when the substrate is cooled to room temperature after deposition), the compressive pre-stress is relieved by an expansion of the substrate surface. For the case where the substrate has a higher CTE than diamond film to be deposited, the expansion can approximately compensate for the previously described undesirable incremental contraction of the substrate due to CTE mismatch.

Figure 8:
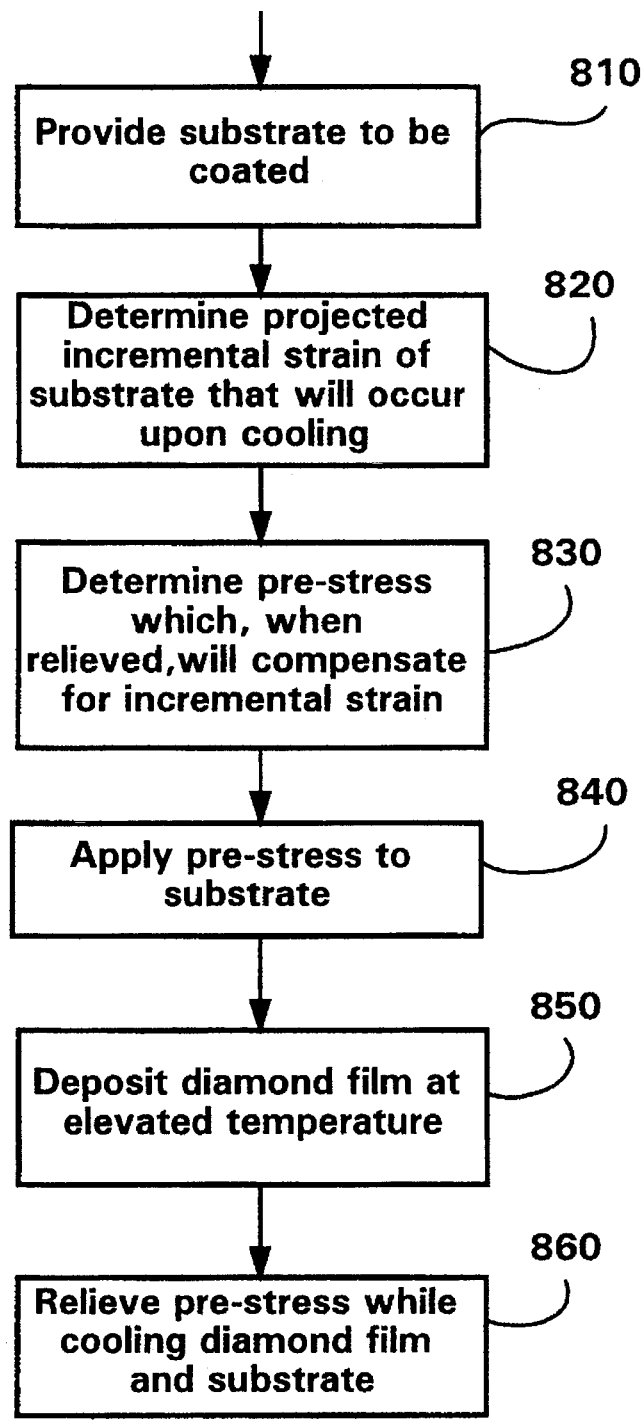
FIG. 8 is a flow diagram of the steps for practicing an embodiment of the technique of the invention.

Referring to FIG. 8, there is shown a flow diagram which represents steps of an embodiment of the method of the invention. The block 810 represents the providing of the substrate to be coated with diamond film. The block 820 represents the determination of the projected incremental strain of the substrate (with respect to the diamond film) that will occur upon cooling of the substrate and diamond film from the deposition temperature to room temperature. This incremental strain, Δx, can be determined from the coefficient of thermal expansion of the substrate, $CTE_s$, the coefficient of thermal expansion of the diamond film, $CTE_d$, and the cooling temperature excursion, ΔT, as follows:

$$\Delta x = \Delta T [CTE_s - CTE_d] \quad (1)$$

The incremental strain will be positive when $CTE_s$ is larger than $CTE_d$, and negative when $CTE_s$ is smaller than $CTE_d$. Next, as represented by the block 830, one can determine the pre-stress which, when relieved, will compensate for the computed incremental displacement, Δx. This pre-stress, S, can be computed from Δx and the Young's modulus of the substrate material, E, and the Poisson's ratio of the material, v, as:

$$S = \Delta x \cdot E/(1-v) \quad (2)$$

The block 840 is then entered, this block representing the application of the pre-stress to the substrate, as described herein. Next, diamond film is deposited, at the deposition temperature (block 850), After deposition, the pre-stress is relieved while cooling the diamond film and the substrate to room temperature, as represented by the block 860. For particular types of deposition equipment or for particular types of microstructure in the coating, the steps 840–860 my be repeated several times. A thin coating of a barrier or bonding material can be placed on top of the substrate, such as when the substrate reacts unfavorably with carbon or if the substrate material does not bond well to diamond. It will be understood that the physical property constants in equation (2) represent properties of the substrate material and not the barrier layer if the coating is too thin to substantially affect the mechanical properties of the system.

Figure 9:
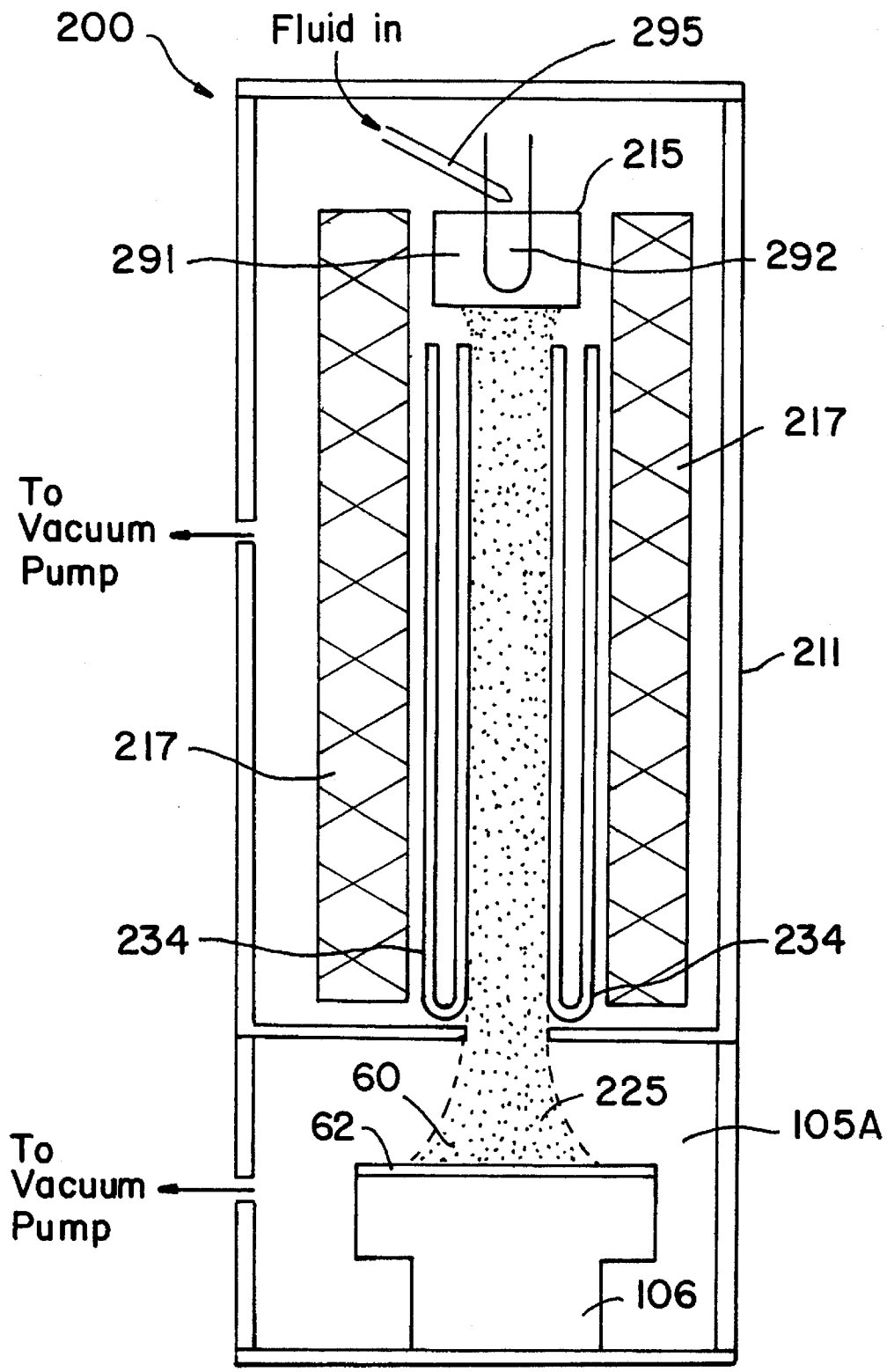
FIG. 9 is a diagram of a plasma jet chemical vapor deposition of a type that can be used in practicing embodiments of the invention.

The invention is applicable to any suitable type of diamond film deposition on a substrate. FIG. 9 shows a diagram of a chemical vapor deposition (CVD) plasma jet deposition system 200 of a type which can be utilized in practicing an embodiment of the invention. The system 200 is contained within a housing 211 and includes an arc-forming section 215 which comprises a cylindrical cathode holder 294, a rod-like cathode 292, and an injector 295 mounted adjacent the cathode so as to permit injected fluid to pass over the cathode 292. A cylindrical anode is represented at 291. In the illustrated system the input fluid may be a mixture of hydrogen and methane. The anode 291 and cathode 292 are energized by a source of electric potential (not shown), for example a DC potential. Cylindrical magnets, designated by reference numeral 217, are utilized to control the plasma generated at the arc forming section. The magnets maintain the plasma within a narrow column until the plasma reaches the deposition region 60. Optional cooling coils 234, in which a coolant can be circulated, can be located within the magnets.

In operation, a mixture of hydrogen and methane is fed to the injector 295, and a plasma is obtained in front of the arc forming section and accelerated and focused toward the deposition region. The temperature and pressure at the plasma formation region are typically in the approximate ranges 1500–15,000 degrees C. and 100–700 torr, respectively, and in the deposition region are in the approximate ranges 800–1100 degrees C. and 0.1–200 torr, respectively. Temperatures in the region above the substrate are in the approximate range 1000°–3500° C. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003, 4,487,162, and 5,204,144.

The bottom portion 105A of the chamber has a base or mandrel 106 on which can be mounted a substrate 10 on which the synthetic diamond is to be deposited. The base can include a temperature controller. The substrate can, if desired, have a prepared surface.

Figure 10:
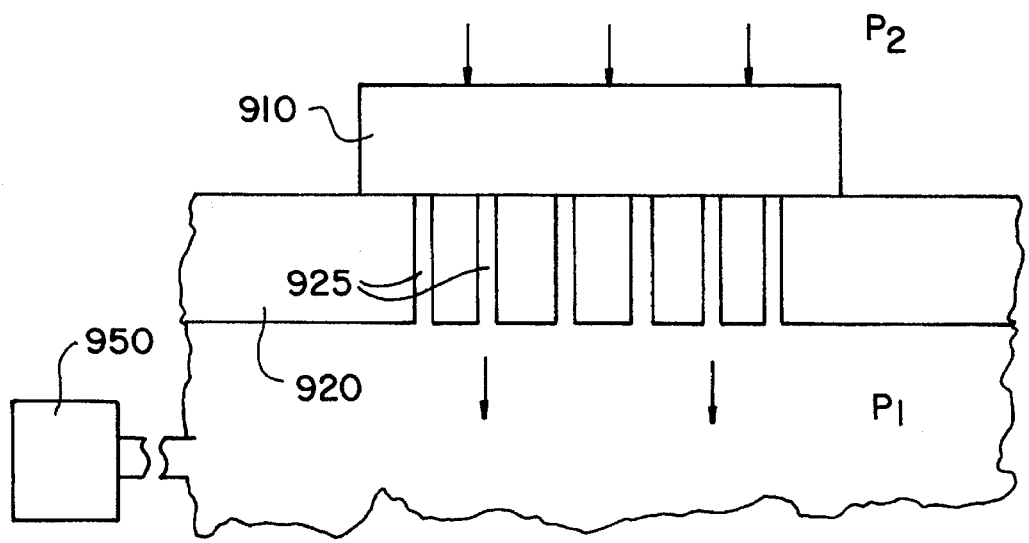
FIG. 10 is a cross-sectional view of a portion of an apparatus that can be used in practicing an embodiment of the invention in which a compressive pre-stress is applied to a substrate on which diamond film is to be deposited.

FIG. 10 illustrates an apparatus and technique that can be utilized to maintain the substrate substantially flat during application of a thermal gradient, in order to apply a pre-stress as first illustrated, for example, in conjunction with FIG. 7. The thermal gradient can be applied, for example, by utilizing the heat from the deposition source. In the embodiment of FIG. 9, a mandrel 920 supports the substrate 910 on which diamond film is to be deposited. The mandrel has a number of apertures 925 that underlie the substrate. A pressure differential can be applied to substantially prevent the substrate from bending to relieve the pre-stress that is applied by virtue of a temperature gradient across the thickness of the substrate. In this example, the pressure $P_2$ can be maintained lower than the pressure $P_1$ by appropriate vacuum pumping of the lower portion of the deposition chamber, as represented by the vacuum pump 950, which can be part of an overall pressure control system of the deposition apparatus. After deposition of the diamond, the pre-stress will be relieved, by removal of the thermal gradient as the substrate cools to about room temperature.

Figure 11:
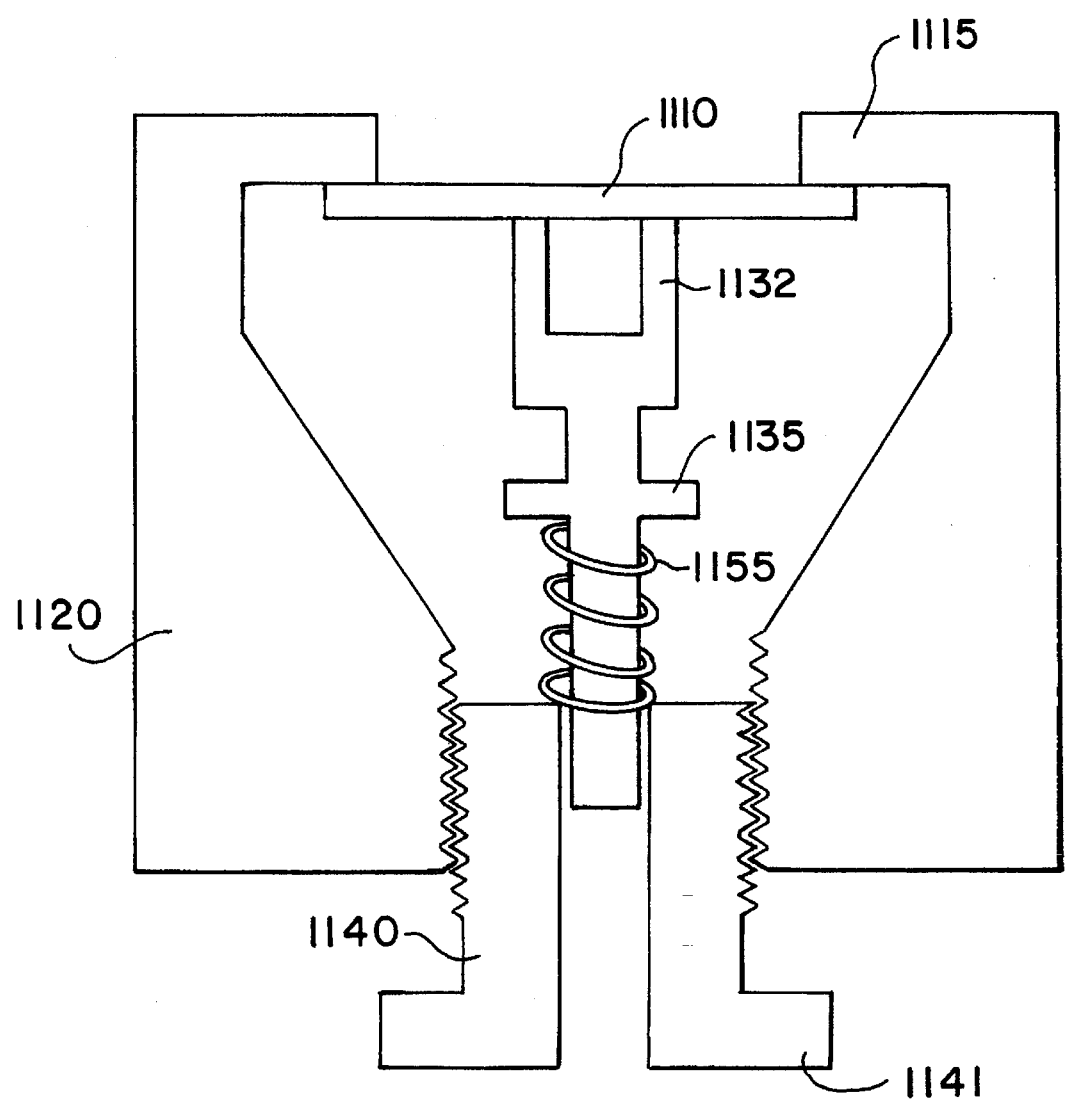
FIG. 11 illustrates an embodiment of an apparatus for bending a substrate to apply a pre-stress thereto.

FIG. 11 illustrates an apparatus and technique for applying a tensile pre-stress to the substrate as first generally described above in conjunction with FIG. 5. A rigid fixture frame 1120 of generally cylindrical outer shape has a top inwardly extending portion in the form of an annular ring 1125, the inner diameter of which is smaller than the diameter of the disc-shaped substrate 1110. [The fixture frame may, for example, be part of the base 106 of the FIG. 9 equipment.] Mounted within the fixture 1120 is a force application member 1130 that includes a shaft 1131 and an upper cup-shaped contact element 1132. The shaft 1131 is slidable in a hollow adjusting bolt 1140 that has outer threading which engages inner threading of the fixture 1120. The adjustment bolt 1140 has a handle as shown at 1141. The shaft 1131 has a collar 1135, and a coil spring 1155 is mounted between the collar 1135 and the front edge of the adjusting bolt 1140.

In operation, the substrate 1110, upon which diamond film is to be deposited, is positioned as shown in FIG. 11, and held between the annular ring 1115 of the fixture 1120 and the contact surface of the force application member 1130. Using the handle 1141, the adjusting bolt 1140 can be tightened, which urges the member 1140 upward via the coil spring 1155 that serves to apply the desired force. Alternatively, the force can be applied by a motor which can be controlled automatically. As first described in conjunction with FIG. 5, the tensile pre-stress in the top surface of the substrate 1110 is released during cooling of the substrate after deposition of diamond film thereon.

In one example of an embodiment of the invention, assume that diamond film, with a coefficient of thermal expansion of about $4 \cdot 10^{-6}/°C$. is to be deposited on a glass substrate, which has a higher coefficient of thermal expansion than diamond; namely, about $6 \cdot 10^{-6}/°C$. [The CTEs are approximate over the temperature range of interest.] The technique of FIG. 10 can be used to prevent the substrate from bending while applying a temperature gradient through the substrate, such as by utilizing the heat from the deposition source. In this example the diamond film and the top surface of the substrate during deposition are at about 620° C. The bottom surface of substrate is maintained at about 220° C. [This means that the average temperature in the glass substrate is about 420° C.] As previously described, this results in a compressional stress in the top surface of the substrate. Upon cooling to room temperature, the glass will cool, on average, by about 400° C. so the substrate strain will be about $400 \cdot 6 \cdot 10^{-6} = 2.4 \cdot 10^{-3}$. The diamond film will cool by about 600°, so the diamond film strain will be about $600 \cdot 4 \cdot 10^{-6} = 2.4 \cdot 10^{-3}$. Accordingly, in this example, the incremental strain is substantially eliminated, so there is little stress on the diamond film during cooling after deposition.

In another example, diamond film (coefficient of thermal expansion of about $4 \cdot 10^{-6}/°C$) is deposited on a $Si_3N_4$ substrate having a lower coefficient of thermal expansion than diamond; namely, about $3.5 \cdot 10^{-6}/°C$. [Again, the CTEs are approximate over the temperature range of interest.] In this example, the diamond film and the top surface of the substrate during deposition are at about 720° C. The cooling temperature excursion, $\Delta T$, is about 700° C. Therefore, using equation (1), the incremental displacement is $$\Delta x = (700)[3.5 \cdot 10^{-6} - 4 \cdot 10^{-6}]$$

$$\Delta x = (700)(-0.5 \cdot 10^{-6})$$

$$\Delta x = -3.5 \cdot 10^{-4}$$

The negative value indicates that the substrate will contract less than the diamond film. Using equation (2), the tensile prestress, in GigaPascals (GPa), which can be applied using the technique of FIG. 11, is $$(3.5 \cdot 10^{-4})(320 \text{ GPa})/(1-0.25) = 0.15 \text{ GPa}$$

where 320 GPa is the Young's modulus of $Si_3N_4$ and 0.25 is its Poisson's ratio. Therefore, upon cooling of the diamond film and substrate, and relief of the pre-stress during the cooling, the incremental contraction of the substrate surface due to relaxation of the tensile pre-stress will approximately equal the incremental contraction of diamond film due to its having a higher CTE than $Si_3N_4$, and there will be little stress on the diamond film during cooling.

The invention has been described with reference to particular preferred embodiments, but variations within the spirit and scope of the invention will occur to those skilled in the art. For example, it will be understood that where a temperature gradient is used in obtaining the pre-stress, the gradient needn't be applied through the entire thickness or across the entire surface of the substrate, and can be applied using a laser or other continuous or pulsed energy source that is stationary or scanned. It can be noted that if the thermal gradient does not persist significantly throughout the substrate, then the part of the substrate that has relatively little thermal gradient may serve to hold the top surface in a stressed condition even without external force. Such a situation can arise if the thermal gradient is generated by a pulsed energy source whose duration is short compared to the time taken for the whole substrate to reach thermal equilibrium, or if the heat extraction from the substrate is substantially non-uniform, or if the heat conductivity of the substrate is a strong function of temperature.

I claim:

1. A method for depositing synthetic diamond film on a substrate, the substrate material having a coefficient of thermal expansion that is different than the coefficient of thermal expansion of the diamond film, comprising the steps of:

pre-stressing said substrate to obtain a pre-deposition compressive stress or tensile stress across a surface thereof;

depositing said diamond film on the pre-stressed substrate surface; and cooling said film and substrate and relieving said pre-deposition stress during said cooling, the strain resulting from relieving said pre-deposition stress opposing the incremental displacement of the substrate with respect to the diamond film that results from the difference in the coefficients of thermal expansion of the diamond film and the substrate material.

2. The method as defined by claim 1, wherein said step of pre-stressing said substrate comprises applying a pre-deposition stress that will result in a strain magnitude of at least $10^{-4}$ in said surface.

3. The method as defined by claim 1, wherein said diamond film is deposited at a substrate surface temperature of at least 500° C., and said step of cooling said film and substrate comprises cooling to about room temperature, and wherein said pre-deposition stress is selected to result in a strain upon relieving of said pre-deposition stress that compensates for incremental strain of said substrate with respect to said diamond film upon said cooling of said film and substrate to about room temperature that results from the difference in the coefficients of thermal expansion of said diamond film and the material of said substrate.

4. The method as defined by claim 2, wherein said diamond film is deposited at a substrate surface temperature of at least 500° C., and said step of cooling said film and substrate comprises cooling to about room temperature, and wherein said pre-deposition stress is selected to result in a strain upon relieving of said pre-deposition stress that compensates for incremental strain of said substrate with respect to said diamond film upon said cooling of said film and substrate to about room temperature that results from the difference in the coefficients of thermal expansion of said diamond film and the material of said substrate.

5. The method as defined by claim 2, wherein said substrate has a higher coefficient of thermal expansion than said diamond film, and wherein said pre-stress is a compressive stress.

6. The method as defined by claim 4, wherein said substrate has a higher coefficient of thermal expansion than said diamond film, and wherein said pre-stress is a compressive stress.

7. The method as defined by claim 2, wherein said substrate has a lower coefficient of thermal expansion than diamond film, and wherein said pre-stress is a tensile stress.

8. The method as defined by claim 4, wherein said substrate has a lower coefficient of thermal expansion than diamond film, and wherein said pre-stress is a tensile stress.

9. The method as defined by claim 1, wherein said prestress is applied to said substrate by bending said substrate.

10. The method as defined by claim 2, wherein said prestress is applied to said substrate by bending said substrate.

11. The method as defined by claim 4, wherein said prestress is applied to said substrate by bending said substrate.

12. The method as defined by claim 1, wherein said prestress is applied by applying a thermal gradient across the thickness of said substrate while substantially preventing said substrate from bending.

13. The method as defined by claim 2, wherein said prestress is applied by applying a thermal gradient across the thickness of said substrate while substantially preventing said substrate from bending.

14. The method as defined by claim 4, wherein said prestress is applied by applying a thermal gradient across the thickness of said substrate while substantially preventing said substrate from bending.

15. The method as defined by claim 12, wherein said relieving of said pre-stress comprises said cooling of said substrate and film, whereby said thermal gradient is removed.

16. The method as defined by claim 14, wherein said relieving of said pre-stress comprises said cooling of said substrate and film, whereby said thermal gradient is removed.

17. The method as defined by claim 21, wherein said prestress is applied to said substrate by applying a thermal gradient across the thickness of said substrate while substantially preventing said substrate from bending with a pressure differential on opposing surfaces of said substrate.

18. The method as defined by claim 14, wherein said prestress is applied to said substrate by applying a thermal gradient across the thickness of said substrate while substantially preventing said substrate from bending with a pressure differential on opposing surfaces of said substrate.

* * * * *